United States Patent
Choi et al.

(10) Patent No.: US 8,276,267 B2
(45) Date of Patent: Oct. 2, 2012

(54) METHOD FOR MOUNTING A COMPONENT ON A CIRCUIT BOARD

(75) Inventors: Hyung-soo Choi, Seongnam-si (KR); Tae-young Lee, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 1029 days.

(21) Appl. No.: 12/247,277

(22) Filed: Oct. 8, 2008

(65) Prior Publication Data
US 2009/0031562 A1    Feb. 5, 2009

Related U.S. Application Data

(62) Division of application No. 11/353,835, filed on Feb. 13, 2006, now Pat. No. 7,448,130.

(30) Foreign Application Priority Data

Oct. 7, 2005  (KR) .......................... 10-2005-0094521

(51) Int. Cl.
*H05K 3/30*    (2006.01)
(52) U.S. Cl. ................ 29/832; 29/739; 29/740; 29/833; 29/840
(58) Field of Classification Search ................ 29/739, 29/740, 832, 833, 840
See application file for complete search history.

(56) References Cited

U.S. PATENT DOCUMENTS

| 4,271,727 | A | | 6/1981 | Brems | |
|---|---|---|---|---|---|
| 5,588,614 | A | * | 12/1996 | Takada et al. | ............... 242/538.2 |
| 6,082,603 | A | | 7/2000 | Takada et al. | |
| 6,162,007 | A | * | 12/2000 | Witte | ........................ 414/416.01 |
| 6,202,728 | B1 | | 3/2001 | Takada et al. | |

OTHER PUBLICATIONS

Office Action established for CN200610075365.6.

* cited by examiner

*Primary Examiner* — Carl Arbes
(74) *Attorney, Agent, or Firm* — Drinker Biddle & Reath LLP

(57) ABSTRACT

Provided are a tape feeder for use in chip mounters that can reduce a chip feeding duration and prevent chips from being turned over or assuming wrong postures to feed the chips stably, and a chip mounting method. The tape feeder includes a second link having one end linked to a link shaft through which a first link and a pivot lever are combined and the other end in which a slot curved at a predetermined inclination is formed. The velocity at which a carrier tape is fed changes according to the inclination of the curve of the slot with respect to the moving direction of the first link, the curve contacting the contact unit upon the movement of the first link in a direction helping to rotate a ratchet gear.

13 Claims, 8 Drawing Sheets

METHOD FOR MOUNTING A COMPONENT ON A CIRCUIT BOARD

CROSS-REFERENCE TO RELATED PATENT APPLICATIONS

This application is a divisional of U.S. patent application Ser. No. 11/353,835 filed on Feb. 13, 2006, now allowed, which claims the benefit of Korean Patent Application No. 10-2005-0094521, filed on Oct. 7, 2005, in the Korean Intellectual Property Office, the disclosure of which is incorporated herein in its entirety by reference.

BACKGROUND OF THE INVENTION

1. Field of the Invention

The present invention relates generally to a tape feeder for use in chip mounters, and more particularly, to a tape feeder for use in chip mounters that includes a carrier tape feeding unit for stably feeding chips, and a chip mounting method therefor.

2. Description of the Related Art

Chip mounters are automated apparatuses used to mount a component, such as, a semiconductor chip, on a predetermined location on a printed circuit board (PCB).

Products such as integrated circuit (IC) chips 5 are susceptible to contamination by foreign matters, such as dust, for example. Hence, to be protected from foreign matters and easily handled, as illustrated in FIG. 1, the IC chips 5 are separately accommodated in an array of accommodating spaces 3b on a carrier 3 of a tape 2. The tape 2 comprising carrier 3 and IC chips 5 is wound around a reel 10 to facilitate handling and transport. The accommodating spaces 3b of the carrier 3 are covered with a tape cover 4. A plurality of transfer holes 3a are formed at predetermined intervals on one edge of a carrier 3 for advancing the carrier 3 when the reel 10 is used with a component mounter including a tape feeding unit.

FIG. 2 is a schematic perspective view of a conventional carrier tape feeding unit used in a tape feeder for chip mounters. Referring to FIG. 2, when a cylinder link 31 connected to a rod 30 of a pneumatic cylinder (not shown) advances to the left, a pivot lever 40 linked to the cylinder link 31 is clockwise pivoted a predetermined distance on a first shaft 63. The clockwise pivoting of the pivot lever 40 moves a pawl 50 downward. When the pawl 50 moves downward, a rotating force is not transmitted to a ratchet gear 60.

When the cylinder link 31 retreats to the right, the pivot lever 40 connected to the cylinder link 31 is counterclockwise pivoted a predetermined distance on the first shaft 63. The counterclockwise pivoting of the pivot lever 40 moves the pawl 50 upward. At this time, because the pawl 50 is engaged with the ratchet gear 60, the ratchet gear 60 rotates counterclockwise.

As described above, only when the cylinder link 31 retreats to the right, the ratchet gear 60 rotates at intervals of a predetermined pitch in one direction, and a sprocket 70 connected to the ratchet gear 60 is also rotated by the rotation of the ratchet gear 60. Since the teeth of the sprocket 70 are configured to mesh or interlock with the transfer holes 3a of the carrier 3 of a component carrier tape 2 (see FIG. 1), the carrier 3 moves at intervals of a predetermined distance and is simultaneously unwound from around the reel 10. At this time, the tape cover 4 is peeled off from the carrier 3 to expose the spaces 3b housing the chips 5 and the tape cover 4 may be wound around a winding unit (not shown). The exposed IC chips 5 are absorbed (i.e., picked up) by an absorbing (e.g., a vacuum) nozzle (not shown) of a chip mounter (not shown), transferred to a predetermined location on a PCB, and mounted on the PCB.

In a conventional carrier tape feeding method, a feeding velocity of the tape 2 is constant from the initial feeding time to the final feeding time. Constant velocity tape feeding often causes an impact (e.g., a sudden jolt) to be generated at ends of the teeth of the sprocket 70 upon the retreat of the cylinder link 31. The impact causes fine components to be turned over or causes them to assume wrong postures prior to being picked up. A shutter 80 is introduced to solve these problems.

When the cylinder link 31 retreats to the right, the shutter 80 advances in the same direction as the direction in which the IC chips 5 move, thereby preventing the IC chips 5 from flipping. On the other hand, when the cylinder link 31 advances to the left, the shutter 80 retreats in the direction opposite to the direction in which the IC chips 5 move, thereby exposing the IC chips 5 so that the absorbing nozzle can pick up the IC chips 5.

However, even when employing the shutter 80, minute components such as, for example, components of a size approximately 0.4×0.2 (mm) may be slightly lifted from the accommodating spaces 3b due to an impact. Hence, when retreating, the shutter 80 rather contacts the components and causes wrong postures or orientations of the components. When the shutter 80, sliding on a guide 90, is installed higher than a predetermined location due to a manufacturing tolerance, the shutter 80 cannot prevent overturn of the minute components.

Until now, to solve these problems the overall speed of feeding fine components has been decelerated, affecting the whole feeding and mounting process. Disadvantageously, overall deceleration of feeding components causes low work efficiency.

SUMMARY OF THE INVENTION

The present invention provides a tape feeder for use in chip mounters that can improve work efficiency and prevent chips from assuming wrong postures, and a chip mounting method therefor.

According to an aspect of the present invention, there is provided a tape feeder comprising: a frame including a fixed gear shaft; a ratchet gear rotating on the fixed gear shaft; a sprocket coupled to the ratchet gear and rotating on the fixed gear shaft, the sprocket being of a predetermined pitch to engage with spaced-apart transfer holes of a tape carrier having a plurality of components for advancing the tape carrier by predetermined intervals; a generally horizontal link with a first end coupled to a reciprocating actuator and a second end, the generally horizontal link extending and retracting horizontally in response to said reciprocating actuator; a pivot lever including an upper end configured for rotation on the fixed gear shaft and a lower end coupled to the second end of the generally horizontal link; a pawl coupled to the pivot lever intermediate the upper and lower ends of the pivot lever and extending generally vertically to selectively mesh with the ratchet gear according to the rotation of the pivot lever, the pawl rotating the ratchet gear upon meshing with the ratchet gear; and a link velocity control unit connected with the generally horizontal link and the lower end of the pivot lever, wherein the link velocity control unit varies a moving velocity of the pivot lever according to a position of the generally horizontal link.

Hence, without substantially increasing the time required to feed a carrier tape, an impact generated at ends of the teeth of the sprocket during the feeding of the carrier tape can be reduced. Due to the reduction of the impact, fine components are prevented from being conventionally turned over or assuming wrong postures. This leads to a stable supply of components to a component mounter.

In some embodiments, the link velocity control unit is configured to interfere with rotation of the pivot lever about the fixed gear shaft when the generally horizontal link is substantially fully retracted. The link velocity control unit may include a contact unit fixed on the frame and a velocity control link comprising a first end including a curved slot moving on the contact unit, and a second end coupled to the second end of the generally horizontal link, and wherein the velocity control link is cammed by the contact unit so that a moving velocity of the pivot lever varies according to an inclination of the curved slot with respect to a moving direction of the generally horizontal link. The inclination of the curved slot causes the first end of the velocity control link to move toward the generally horizontal link during retraction of the generally horizontal link. Furthermore, the velocity control unit may include an elastic element coupling the velocity control link with the generally horizontal link. In some embodiments, the elastic element (e.g., a torsion spring) may have a normal bias to orient the velocity control link away from the generally horizontal link so that the contact unit maintains contact with at least a lower surface of the curved slot.

In some embodiments, the tape feeder further includes a sensor configured on the frame to detect a horizontal orientation of the generally horizontal link. For example, the sensor may be an optical sensor including a light emission part and a light reception part, and a stop bar coupled with the generally horizontal link extends and retracts in response to the reciprocating actuator for movement between the light emission part and the light reception part.

According to another aspect of the present invention, there is provided a method for mounting a component on a circuit board with a component mounter including a tape feeding unit having a velocity control unit, the method comprising steps of: preparing a printed circuit board to accept components from the component mounter; actuating the tape feeding unit to advance a tape carrier at an initial feeding velocity; removing a tape cover from the tape carrier to expose a component; substantially simultaneously with the removing step, decelerating, with the velocity control unit, the advance of the carrier tape to a second velocity slower than the initial feeding velocity; picking up the component using a nozzle head; and disposing the component on a predetermined location on the printed circuit board using the nozzle head.

In an embodiment relative to the first aspect, the decelerating step may include the steps of: configuring a contact unit on a frame of the tape feeding unit; configuring a slot having a non-horizontal portion in a first end of said velocity control link; contacting said contact unit with said slot; connecting a second end of said velocity control link with a rotating pivot lever and with an end of a generally horizontal link connected to a portion of said rotating pivot lever; and translating said generally horizontal link in the direction in which the tape carrier is being advanced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1:
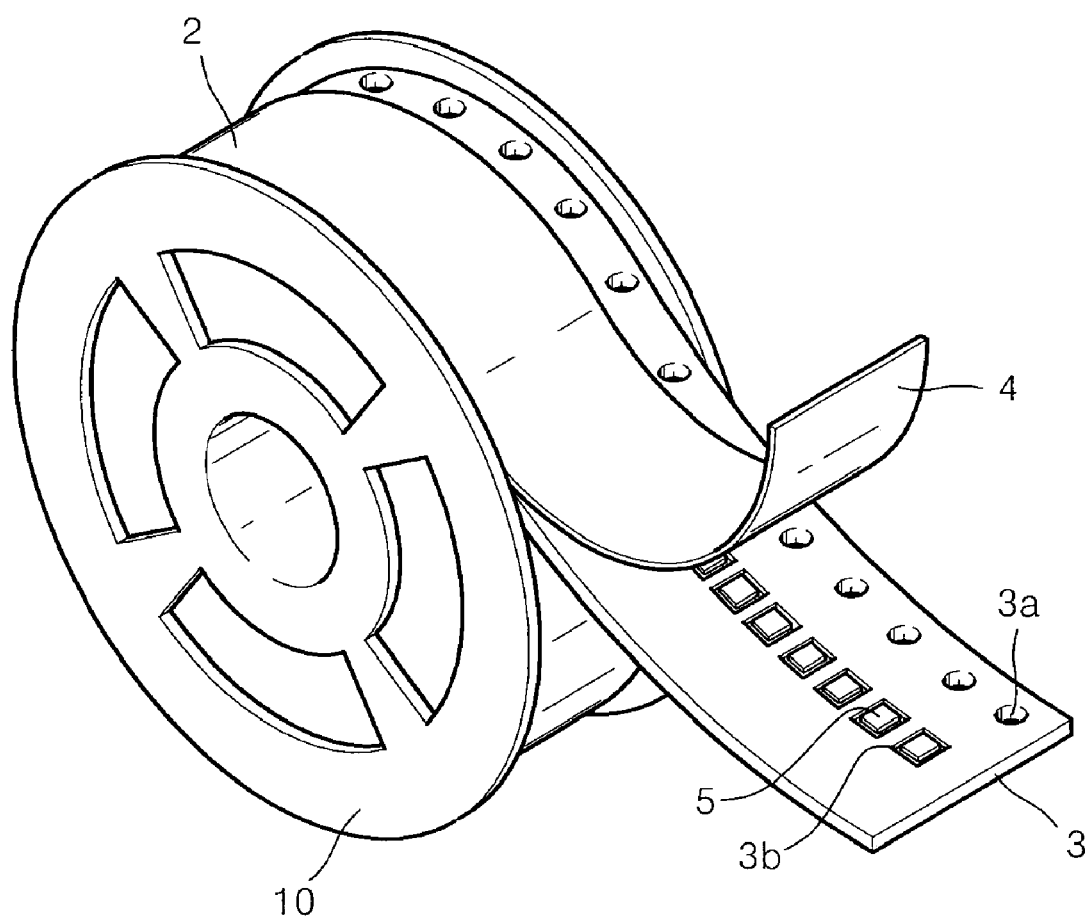
FIG. 1 is a perspective view of a component carrier tape.
Figure 3A:
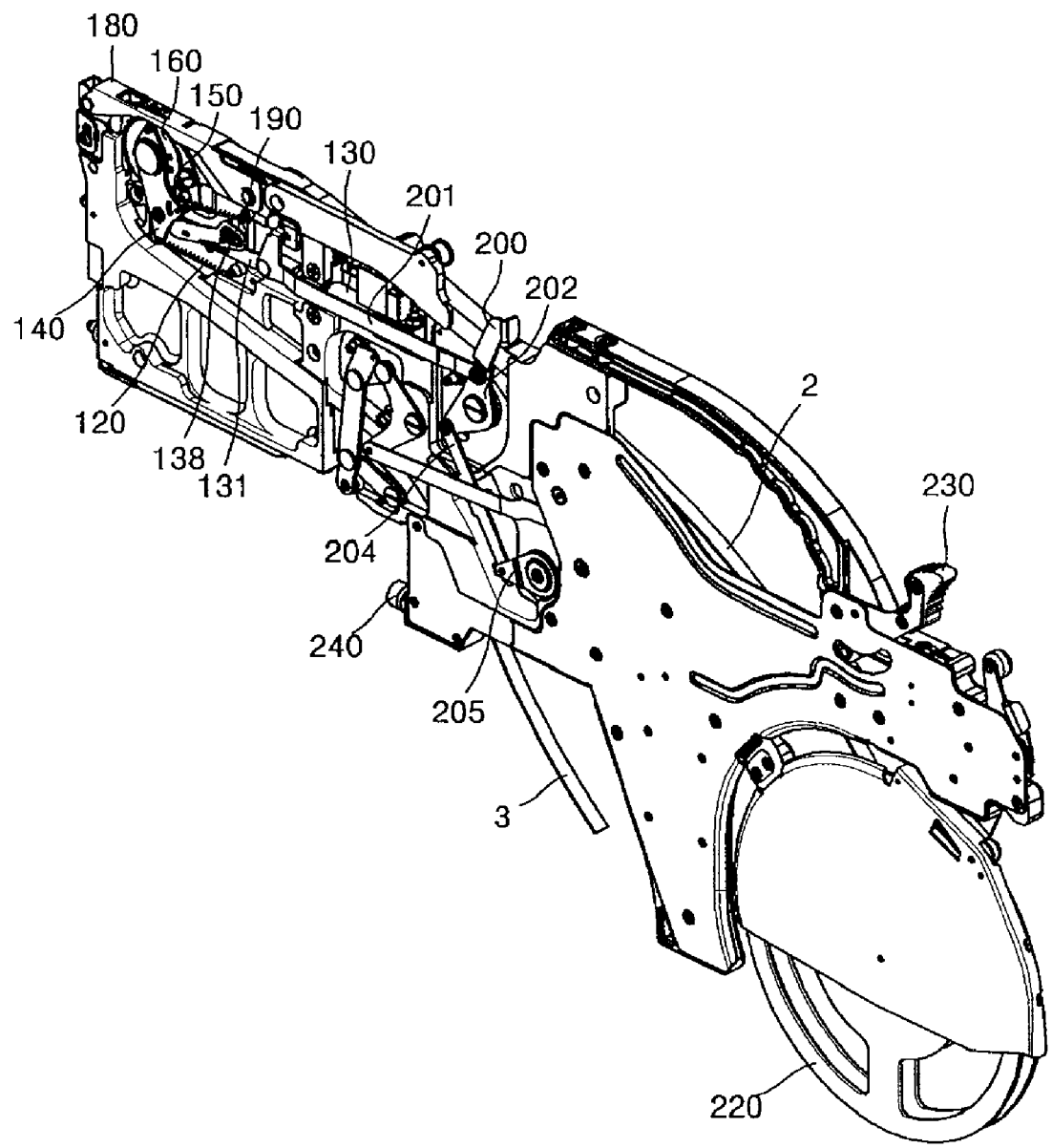
FIGS. 3A and 3B are perspective views of a tape feeder for use in chip mounters, according to an exemplary embodiment of the present invention.
Figure 3B:
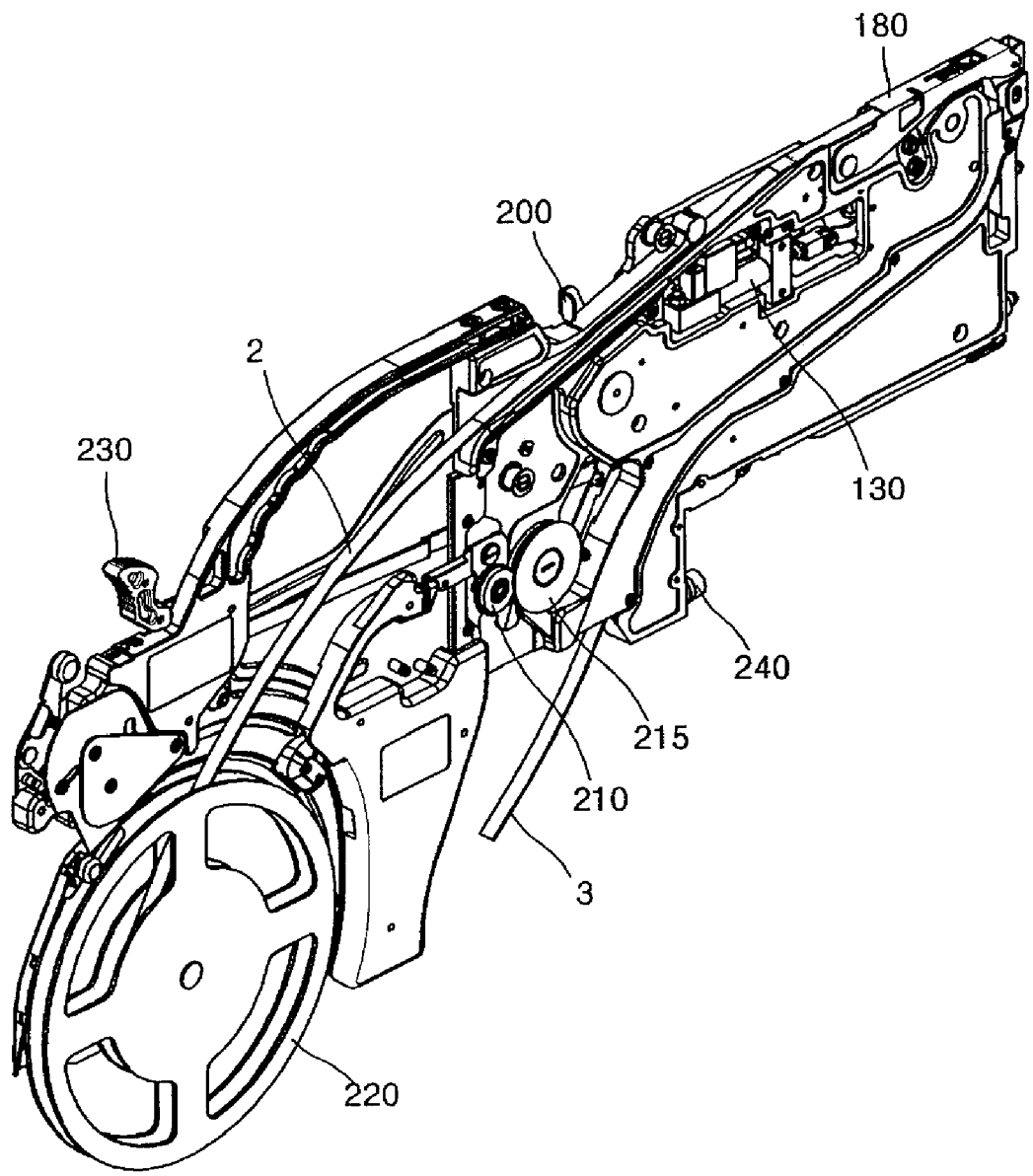

FIGS. 3A and 3B are perspective views of an embodiment of a tape feeder for use in chip mounters, according to an aspect of the present invention. A carrier tape feeding unit is installed in a front part of the tape feeder. The carrier tape feeding unit feeds a carrier tape 2 (FIG. 1), which accommodates chips 5, at intervals of a predetermined pitch.

Figure 4:
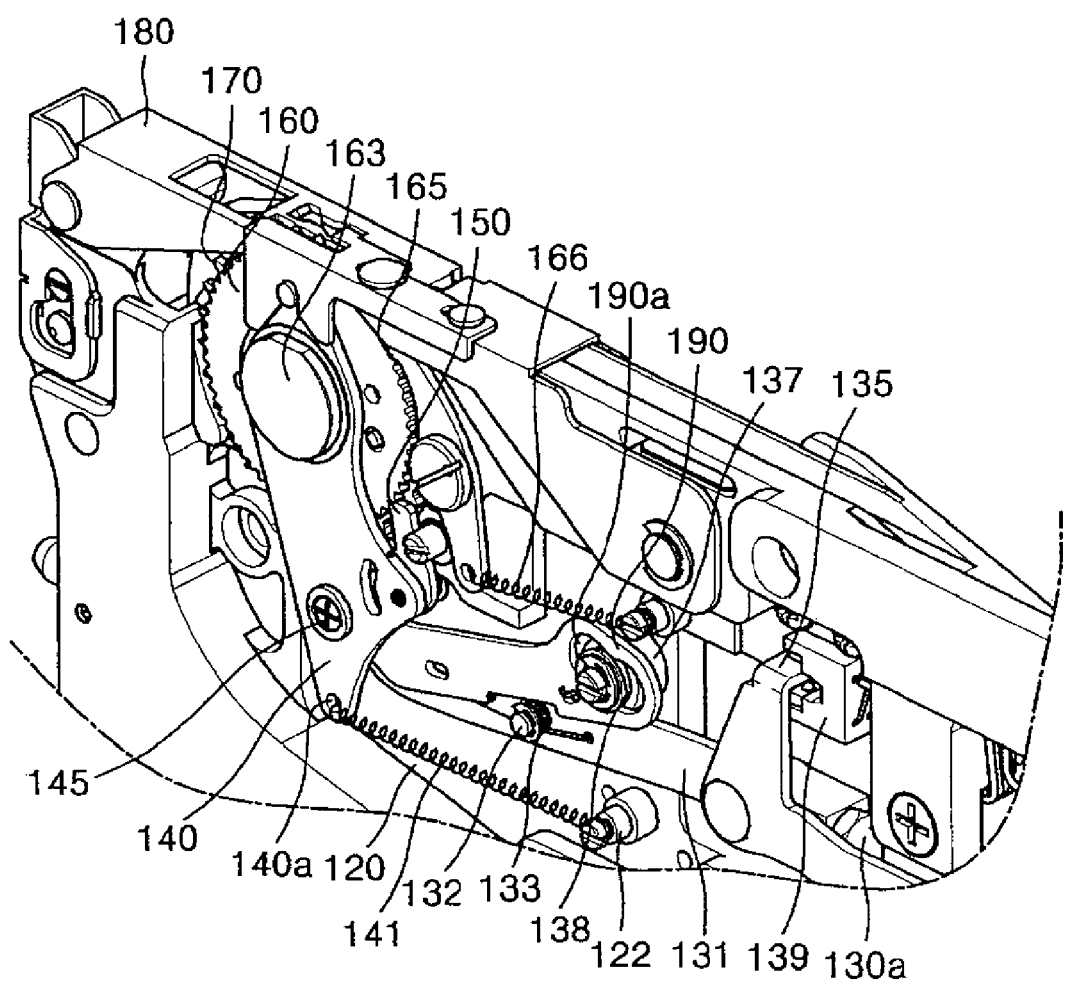
FIG. 4 is an enlarged perspective view of a carrier tape feeding unit included in the tape feeder illustrated in FIGS. 3A and 3B.
Figure 5A:
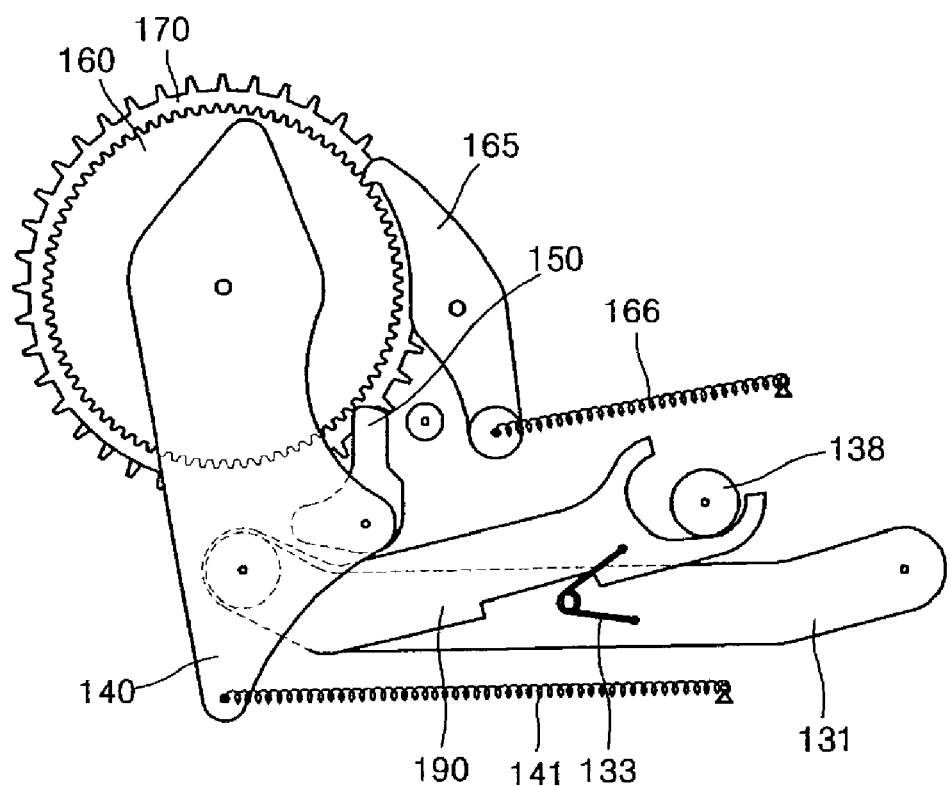
FIG. 5A is a schematic plan view of the carrier tape feeding unit illustrated in FIG. 4.

FIG. 4 is an enlarged perspective view of the carrier tape feeding unit included in the tape feeder illustrated in FIGS. 3A and 3B. FIG. 5A is a schematic plan view of the carrier tape feeding unit illustrated in FIG. 4. The carrier tape feeding unit includes a frame 120, a ratchet gear 160, a sprocket 170, a pawl 150, a pivot lever 140, a first link 131, a second link 190, a contact unit including a bearing shaft 137 and a bearing 138, a torsion spring 133, a reverse rotation preventing unit 165, and a position detection unit 139.

The function and operation of the carrier tape feeding unit will now be described. Referring to FIGS. 3A through 5A, when a rod 130a of a linear actuator such as pneumatic cylinder 130, which is connected to an air inhale duct 240, extends, the first link 131 moves or translates to the left so that the pivot lever 140 linked to the first link 131 is clockwise pivoted a predetermined interval on a gear shaft 163. At this time, a pawl 150, which selectively contacts or meshes with a lower portion of a ratchet gear 160, moves downward. The pawl 150 moving downward disengages from the ratchet gear 160, such that a rotating force is not transmitted to the ratchet gear 160.

When the rod 130a retracts (to the right) into the cylinder 130, the first link 131 translates to the right, and the pivot lever 140 is counterclockwise pivoted a predetermined interval on the gear shaft 163. The left end of the second link 190 is linked to a juncture between the first link 131 and the pivot lever 140. A slot 190a includes a curved (cam) surface, which contacts the bearing 138 of the contact unit (i.e., a fixed cam follower), that is formed on the right end of the second link 190. The slot 190a is generally kidney-shaped and has a lower curved surface having one portion with a predetermined upward inclination that is forward of a generally horizontal rearward portion. That is, the curved surface of the slot 190a has a forward, upward-inclined portion with respect to a generally horizontal direction in which the first link 131 moves.

Accordingly, when the first link 131 retreats to the right, a rightward moving force is applied to the left end of the second link 190. Furthermore, when the first link 131 and second link 190 translate to the right, the stationary contact unit including a bearing shaft 137 and a bearing 138 causes the right end of the second link 190 to move downward (i.e., camming the second link 190) so that a pivoting speed of the pivot lever 140 varies with the inclination of the curved surface of the slot 190a that contacts the bearing 138. Although the slot 190a is illustrated as being generally kidney-shaped, it may be configured otherwise so that the inclination of the curved surface of the slot 190a is formed so that the pivot lever 140 can pivot slowly during only the closing period (which occupies about 50 to 100% of the entire feeding period) of the feeding operation and pivot fast during the remaining period.

In other words, when the first link 131 retreats to the right, the counterclockwise rotation of the pivot lever 140 is fast during the initial and middle periods and is slowed down during the closing period due to an interaction between the curved surface of the slot 190a of the second link 190 and the bearing 138.

Accordingly, the feeding period is not very long, and fine components are prevented from being conventionally turned over or assuming wrong postures due to an impact upon the ends of the teeth of the sprocket 170. This leads to an improvement in the component mounting process efficiency.

As best shown in FIG. 3A, a third link 201, which extends backward from the carrier tape feeding unit, has a left end that is connected to the first link 131 of the carrier tape feeding unit. The right end of the third link 201 is connected to one end of a triangular lever 202. The other end of the triangular lever 202 is connected to one end of a fourth link 204. The other (distal) end of the fourth link 204 is connected to one end of another pivot lever 205 for driving a pair of discharge gears 210 and 215 (FIG. 3B) of a tape cover discharge unit. The second pivot lever 205 is connected to the discharge gears 210 and 215 to drive the discharge gears 210 and 215 in one direction.

Hence, without special driving units for driving the tape cover discharge unit, the discharge gears 210 and 215 of the tape cover discharge unit may be rotated upon the retraction of the first link 131 during the feeding process, thereby pulling and discharging a tape cover 4 (FIG. 1) that is peeled off from the carrier tape 2. The tape cover discharge unit may additionally wind up the peeled tape cover around a predetermined reel.

A clamp lever 230 is used when the tape feeder is fitted onto a fix stand of a chip mounter. A manual lever 200 is used when advancing and retreating the first link 131 manually without operating the air cylinder 130.

The aforementioned components of the carrier tape feeding unit will now be described in greater detail.

The frame 120 combines the components together and supports the same.

As shown in FIG. 4, the ratchet gear 160 rotates about the gear shaft 163 fixed on the left upper part of the frame 120, and then the carrier tape 2 (FIG. 1) moves at intervals of a predetermined pitch. The sprocket 170 is coupled to the ratchet gear 160 and rotates together with the ratchet gear 160 about the gear shaft 163. The diameter of the sprocket 170 may be larger than that of the ratchet gear 160 as shown in FIG. 5A. A pitch (i.e., the distance between equivalent points on adjacent teeth) of the sprocket 170 is equal to an interval or distance between transfer holes 3a of the component carrier tape 2. Thus, the sprocket 170 is configured to continuously move the component carrier tape 2 in discrete intervals in a direction in which the sprocket 170 rotates.

However, the present invention is not limited to the use of the sprocket 170. As can be appreciated, the sprocket 170 may not be installed and the ratchet gear 160 may directly transfer the component carrier tape 3 at intervals of a predetermined pitch in a direction in which the ratchet gear 160 rotates. In this case, the predetermined pitch denotes a pitch between teeth of the ratchet gear 160 that is configured to correspond with the interval between transfer holes 3a of the component carrier tape 2.

The ratchet gear 160 is configured to rotate only in one direction because of the pawl 150. Although the ratchet gear 160 may only rotate counterclockwise as discussed above, the technical scope of the present invention is not limited to the counterclockwise rotation and the rotating direction of the ratchet gear 160 may be any suitable direction as long as it is the same as the transferring direction of the component carrier tape 2.

As best illustrated in FIG. 5A, the pawl 150 couples with and extends upward from the right part of the pivot lever 140, which pivots on the gear shaft 163 by a predetermined angle. The upper part of the pivot lever 140 is disposed on the gear shaft 163 for rotation thereon, and the lower part of the pivot lever 140 is linked to the first link 131. A spring 141 is connected between a hole 140a at the bottom end of the pivot lever 140 and a protrusion 122 protruding on a right part of the frame 120. Accordingly, the spring 141 provides a restoring force to the pivot lever 140 and first link 131 when the first link 131 translates to the left.

The left end of the second link 190 is linked to a link shaft 145 (FIG. 4) by which the left end of the first link 131 is coupled to the lower part of the pivot lever 140. The right end of the first link 131 is connected to the cylinder rod 130a such that the forward and backward reciprocation of the first link 131 is transformed into a reciprocating pivot motion of the pivot lever 140 on the gear shaft 163.

A link velocity control unit includes the contact unit (which is made up of the bearing shaft 137 and the bearing 138) and the second link 190.

The slot 190a, which is formed on the right end of the second link 190, is curved at a predetermined inclination with respect to the moving direction of the first link 131. The slot 190a is fitted between the bearing 138 and the bearing shaft 137 that protrude from the surface of the frame 120 so that the second link 190 translates on the stationary contact unit. The slot 190a is curved so that a pivoting speed of the pivot lever 140 can vary according to the inclination of the curve of the slot 190a that contacts the bearing 138 upon the movement of the first link 131 in a direction helping to rotate the ratchet gear 160, that is, upon the retraction (i.e., rightward translation) of the first link 131.

The bearing shaft 137 and the bearing 138 support the right end of the second link 190. The bearing 138 is coupled to the bearing shaft 137. Hence, the bearing 138, which contacts the curve of the slot 190a of the second link 190, rotates when the second link 190 reciprocates forward and backward such that a friction between the slot 190a and the shaft 137 is reduced.

The present invention is not limited to this link velocity control unit according to the present embodiment and the link velocity control unit may be any unit known in the art for reducing a velocity of the pivot lever 140.

In an example, one end (left end) of the second link 190 is linked to the link shaft 145 through which the first link 131 and the pivot lever 140 are combined, and the other end (right end) thereof has no slot 190a for accepting a contact unit. Instead, the outer circumference of the right end of the second link 190 may be curved so that the bearing 138 contacts and acts as a cam follower on the curved outer circumference of the right end of the second link 190. In other words, in contrast with the previously described embodiment in which the bearing 138 is located within the slot 190a, the bearing 138 is located over the second link 190 so that the lower part of the bearing 138 contacts the upper outer circumference of the second link 190.

Hence, similar to the previous embodiment, when the first link 131 retreats, the first link 131 and the pivot lever 140 move at a velocity equal to the initial feeding velocity at first, and the moving direction of the second link 190 is changed with respect to the moving direction of the first link 131 at the last feeding period, so that deceleration occurs.

Figure 5B:
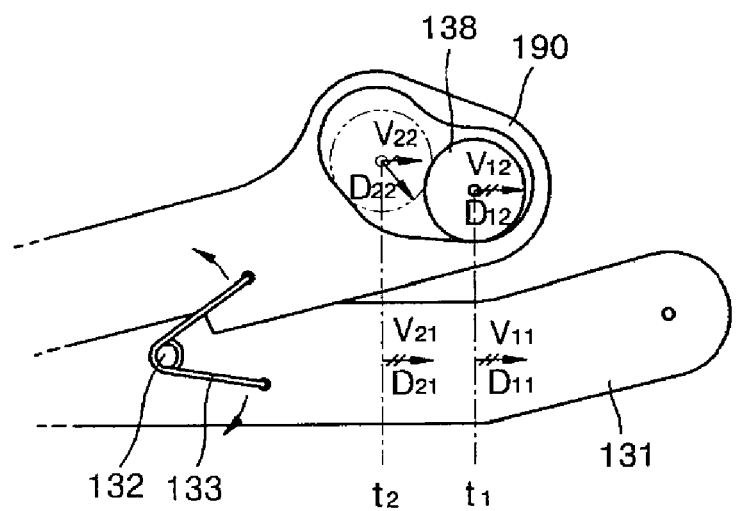
FIG. 5B illustrates a mechanism in which the carrier tape feeding unit illustrated in FIGS. 4 and 5A decelerates.

FIG. 5B further illustrates a mechanism for decelerating tape feeding of the carrier tape feeding unit illustrated in FIGS. 4 and 5A. Referring to FIG. 5B, a torsion spring 133 is retained on the protrusion 132 formed on the first link 131. One end of the torsion spring 133 is connected to the first link 131 intermediate its right and left ends, and the other end of the spring 133 is connected to the second link 190 proximate the slot 190a. The torsion spring 133 may be compressed by a downward movement of second link 190 and provides a normal bias or force to widen a gap or otherwise separate the first link 131 and the second link 190 so that the bearing 138 maintains contact with and moves along the bottom surface of slot 190a.

It is not necessary to configure the torsion spring 133 at the location illustrated in FIG. 5B and it may alternatively be installed such that its center is retained by the link shaft 145 (FIG. 4) and its both ends are fixed to the first and second links 131 and 190.

Although a torsion spring 133 is illustrated for applying an elastic force between the first and second links 131 and 190 in FIG. 5B, the present invention is not limited to the torsion spring 133 and may alternatively be other elastic members or devices known in the art. For example, a bar-shaped coil spring may be used. When the bar-shaped coil spring is used in place of the torsion spring 133, one end of the bar-shaped coil spring may be connected to the first link 131, and the other end thereof may be connected to the second link 190. Alternatively, one end of the bar-shaped coil spring may be connected to a fixed member such as the frame 120, and the other end thereof may be connected to the second link 190.

As shown in FIG. 5B, at an initial and middle point of time t1 during a retraction (i.e., rightward translation) of the first link 131, the second link 190 also moves in a direction D12 equal to a moving direction D11 of the first link 131. Hence, a moving velocity V11 of the right end of the first link 131 is equal to a moving velocity V12 of the right end of the second link 190, and the velocity of a tangential movement of the pivot lever 140 linked to the left end of the second link 190 is equal to the moving velocity V12 of the right end of the second link 190. In other words, the movement of the pivot lever 140 does not decelerate before an end point of time t2 of the retraction of the first link 131.

However, at the end point of time t2 during the retraction of the first link 131, the right end of the second link 190 moves in a direction D22 tilted downward with respect to the moving direction D21 of the first link 131, thereby generating a vertical component velocity which reduces the horizontal component velocity. Thus, a moving velocity V22 of the right end of the second link 190 becomes slightly slower than a moving velocity V21 of the right end of the first link 131. In addition, the velocity of the tangential movement of the pivot lever 140 linked to the left end of the second link 190 becomes smaller than the moving velocity V21 of the right end of the first link 131. In other words, the movement of the pivot lever 140 interferes with the first link 131 to decelerate the pivot lever 140 at the end point of time t2 during the retreat of the first link 131.

Although the first link 131 reciprocates at a substantially constant velocity, the rotations of the pivot lever 140, the ratchet gear 160, and the sprocket 170 are slowed down at the feeding end point of time, so that generation of an impact upon the ends of the teeth of the sprocket 170 can be substantially reduced or prevented.

In other words, by using the second link 190 having the curved slot 190a and suitably designing the curve of the slot 190a, feeding can be stabilized, and the feeding time can be reduced.

The present invention is not limited to the curved kidney-like shape of the slot 190a of the second link 190 illustrated in FIG. 5B, but any suitable arcuate, curvilinear or polylinear shape known in the art may be used for moving the second link 190 with respect to the first link 131 to decelerate the rotation of the pivot lever 140.

Figure 2:
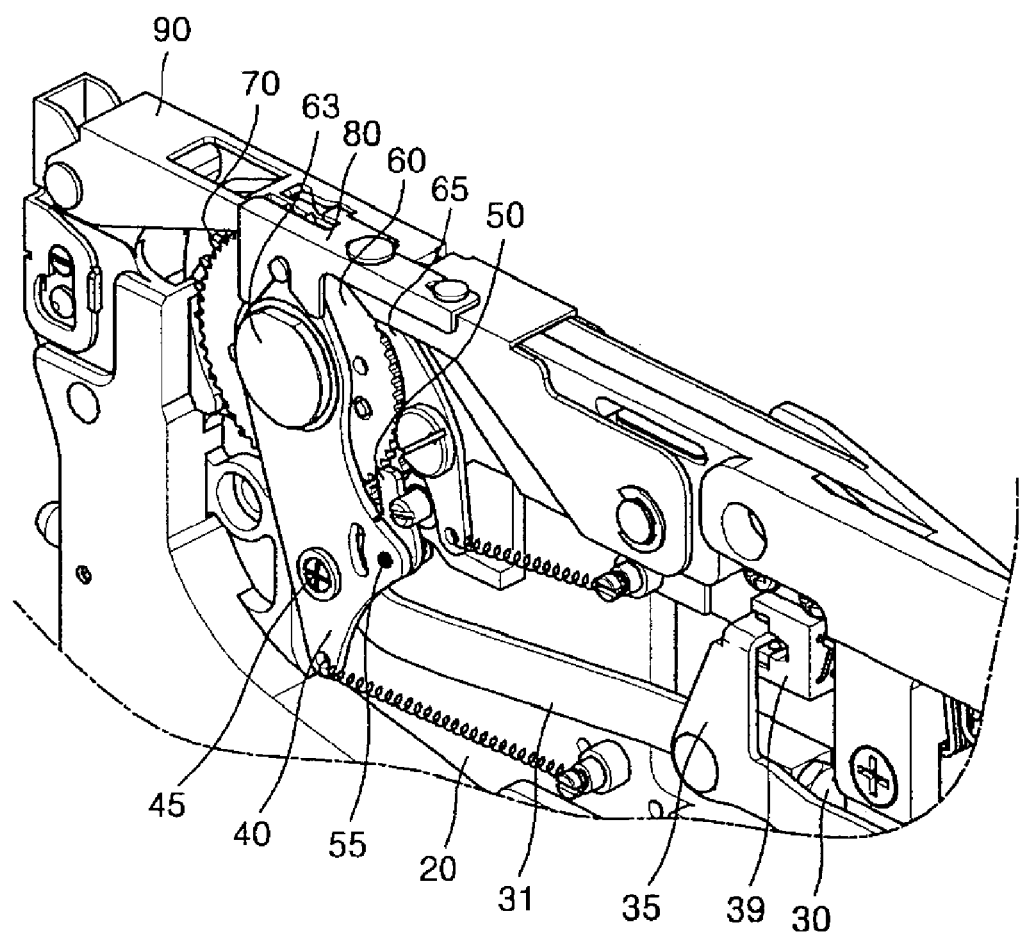
FIG. 2 is a schematic perspective view of a conventional carrier tape feeding unit used in a tape feeder for chip mounters.
Figure 6A:
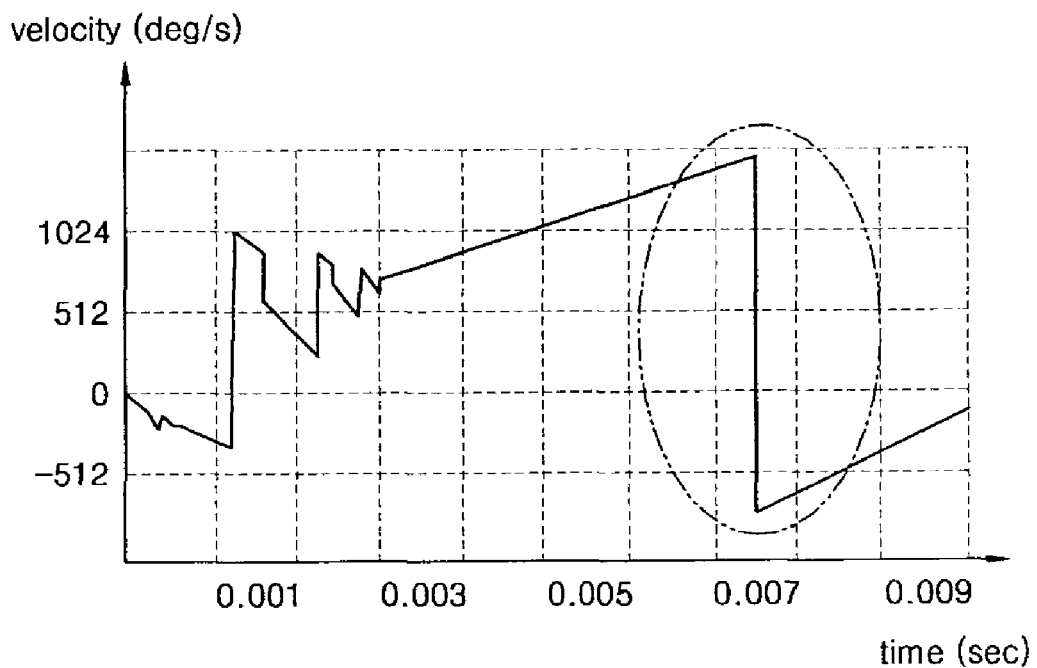
FIG. 6A is a graph showing a velocity of a feeder part of the conventional carrier tape feeding unit of FIG. 2 versus time.
Figure 6B:
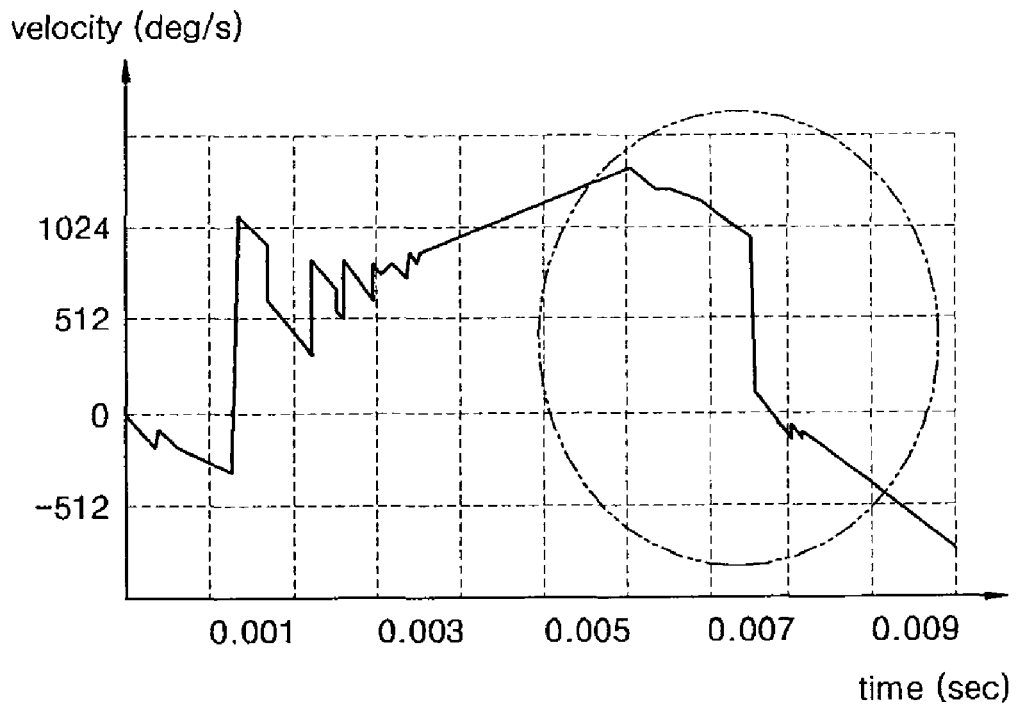
FIG. 6B is a graph showing a velocity of a feeder part of the carrier tape feeding unit of FIGS. 3A through 4 versus time.

FIG. 6A is a graph showing a velocity versus time of a feeder part of the conventional carrier tape feeding unit shown in FIG. 2. FIG. 6B is a graph showing a velocity versus time of a feeder part of the subject carrier tape feeding unit of FIGS. 3A through 5B. Referring to FIG. 6A, a rotational speed of the ends of the teeth of the sprocket 170 decreases sharply at an instant about 0.007 seconds. This sharp decrease in velocity indicates an impact (e.g., a sudden jolt) that is applied to the component carrier tape 2 by the sprocket 170 that directly causes components to be turned over or assume wrong postures.

On the other hand, referring to FIG. 6B, a rotational speed at about 0.007 seconds decreases substantially more gently than as shown in FIG. 6A. Thus, FIG. 6B indicates that an impact that is applied by the sprocket 170 to the component carrier tape 2 is reduced.

Referring back to FIG. 5A, a reverse rotation preventing unit prevents the ratchet gear 160 from rotating in the direction opposite to the direction in which the ratchet gear 160 is rotated by the pawl 150. A stop pawl 165 which only allows a rotation in one direction with an idle operation in the other direction may be used as the reverse rotation prevent unit. A spring 166 is connected between a hole formed in the lower end of the stop pawl 165 and a protrusion on the right part of the frame 120 to maintain contact of the stop pawl 165 with the ratchet gear 160. However, the present invention is not limited to the stop pawl 165, and various equivalents that allow the ratchet gear 160 to rotate only in one direction may be used, for example the pawl 150.

Referring back to FIG. 4, an optical sensor 139 is installed at a location generally above a moving path of the first link 131. A stop bar 135 coupled to the first link 131 moves horizontally in and out (in relative synchronism with the reciprocation of first link 131) of a space between a light emission part and a light reception part of the optical sensor 139. The optical sensor 139 checks whether light emitted from a photodiode of the light emission part and incident upon the light reception part is blocked by the stop bar 135, thereby detecting a location of the first link 131 along its horizontal travel.

In other words, the optical sensor 139 detects whether the first link 131 has properly retreated by a predetermined distance to move the ratchet gear 160 a predetermined pitch.

Although the optical sensor 139 is illustrated as a location detecting unit in FIG. 4, various equivalents such as a limit switch and a ultrasonic sensor may be used.

Figure 7:
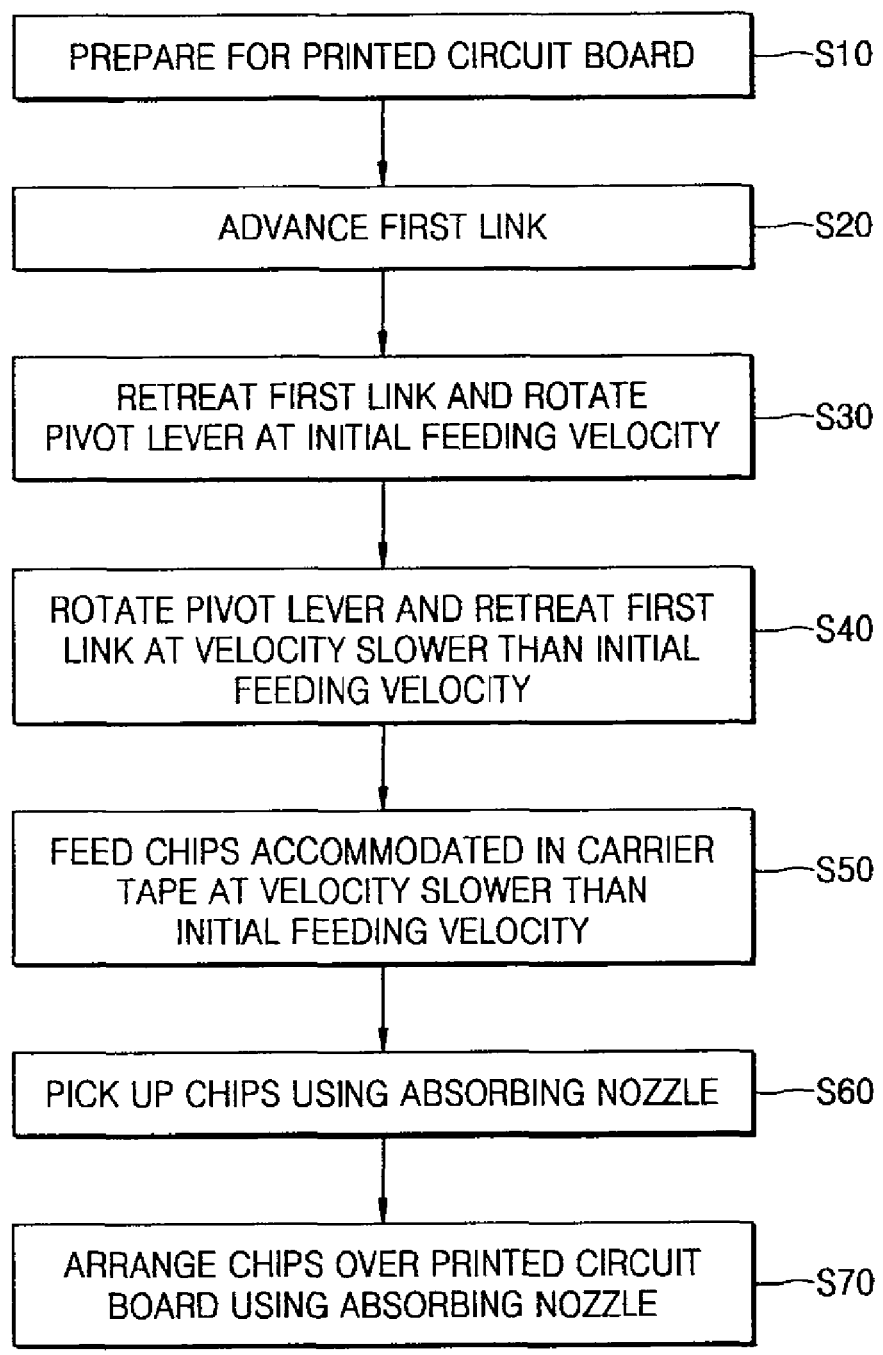
FIG. 7 is a flowchart illustrating a chip mounting method according to an exemplary embodiment of the present invention.

FIG. 7 is a flowchart illustrating a chip mounting method employing a chip mounter including the subject tape feeding unit discussed above and illustrated in FIGS. 3A-5B, according to another aspect of the present invention. First, in operation S10, a printed circuit board (PCB), which may be supplied through a loader, is transferred to a screen printer for coating locations on the PCB to be soldered with to-be-mounted components with solders, and the PCB is transferred to the chip mounter.

In operation S20, the cylinder 130 of the tape feeding unit of the chip mounter advances the first link 131.

In operation S30, when the first link 131 advances, the ratchet gear 160 does not rotate. When the first link 131 retreats, the pivot lever 140, whose one end is linked to one end of the first link 131 and which pivots a predetermined angle on the gear shaft 163 fixed on the frame 120, is rotated at an initial feeding velocity, and the retreat of the first link 131 keeps the initial feeding velocity.

In operation S40, the moving velocities of at least one of the pivot lever 140 and the first link 131 are reduced by the link velocity control unit, which has one end linked to the link shaft 145, through which the first link 131 and the pivot lever 140 are combined, and reduces the moving velocity of the pivot lever 140 by changing the moving direction of the other end of the link velocity control unit according to a moving direction of the first link 131.

To be more specific, the moving velocities of the first link 131 and the pivot lever 140 are reduced due to the inclination of the curve of the slot 190a with respect to the moving direction of the first link 131.

In operation S50, the pawl 150 coupled to the decelerating pivot lever 140 reduces the rotation of the ratchet gear 160 in one direction about the gear shaft 163 due to the deceleration of the pivot lever 140, such that the chips 5 accommodated in the component carrier tape 2 are fed at a reduced velocity. The tape cover 4 is peeled off from the carrier 3 and discharged by the tape cover discharge unit.

Due to the feeding of the fine chips 5 at a non-constant (i.e., partially decelerating) velocity, an impact upon the ends of the teeth of the sprocket 170 is reduced, and thus the fine chips 5 are prevented from assuming wrong postures or flipping. Consequently, the chips 5 can be stably fed.

In operation S60, a nozzle head of the component mounter that includes a plurality of absorbing nozzles moves over the chips 5 exposed by the tape feeder and absorbs and picks up the chips 5. Thereafter, in operation S70, the nozzle head moves over the PCB and arranges the chips 5 over predetermined locations on the PCB, for example, using blown air.

When the chips 5 are all arranged on the PCB, the PCB is transferred to a reflower and reflowed thereby so that the mounted chips 5 are firmly fixed to the PCB. Thereafter, the PCB having the chips 5 is inspected by an inspecting machine to check whether chip mounting is normal or abnormal. Then, the chip mounting is completed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for mounting a component on a circuit board with a component mounter including a tape feeding unit having a velocity control unit, the method comprising:
   preparing a printed circuit board to accept components from the component mounter;
   actuating the tape feeding unit to advance a tape carrier at an initial feeding velocity;
   removing a tape cover from the tape carrier to expose a component;
   substantially simultaneously with the removing step, decelerating, with the velocity control unit, the advance of the carrier tape to a second velocity slower than the initial feeding velocity;
   picking up the component using a nozzle head; and
   disposing the component on a predetermined location on the printed circuit board using the nozzle head.

2. The method of claim 1 wherein the decelerating step comprises camming a velocity control link of said velocity control unit to have a velocity component generally perpendicular to a direction in which the tape carrier is being advanced.

3. The method of claim 2 wherein the camming step comprises:
   configuring a contact unit on a frame of the tape feeding unit;
   configuring a slot having a non-horizontal portion in a first end of said velocity control link;
   contacting said contact unit with said slot;
   connecting a second end of said velocity control link with a rotating pivot lever and with an end of a generally horizontal link connected to a portion of said rotating pivot lever; and
   translating said generally horizontal link in the direction in which the tape carrier is being advanced.

4. The method of claim 3 wherein the translating step further comprises reciprocating said generally horizontal link to move said slot back and forth on said contacting unit.

5. The method of claim 3 further comprising the step of coupling said velocity control link and said generally horizontal link with a torsion spring.

6. The method of claim 5 wherein the coupling step comprises:
   attaching a first end of said torsion spring intermediate right and left ends of said generally horizontal link; and
   attaching a second end of said torsion spring proximate said slot.

7. A method for mounting a component on a circuit board using a component mounter that includes a tape feeding unit, the method comprising:
   configuring the tape feeding unit with a sprocket having teeth of a predetermined pitch to engage with spaced-apart transfer holes of a tape carrier which stores components, a generally horizontal link, a reciprocating actuator coupled with a first end of the generally horizontal link for extending and retracting the generally horizontal link, a pivot lever including a fixed end connected with a shaft on which the sprocket rotates and a free end coupled with a second end of the generally horizontal link, a pawl connected to the pivot lever intermediate upper and lower ends of the pivot lever for selectively rotating the sprocket relative to rotation of the pivot lever, and a link velocity control unit with a contact unit and a velocity control link including a first end having a curved slot moving on the contact unit and a second end coupled to the second end of the generally horizontal link;
   activating the reciprocating actuator to move the generally horizontal link and pivot lever for rotating the sprocket at an initial tape-feeding rotational velocity;
   removing a tape cover from a tape carrier to expose a component;
   substantially simultaneously with the removing step, decelerating the tape carrier by using the velocity control unit, the velocity control link interfering with reciprocating movement of the generally horizontal link for rotating the sprocket at a second tape-feeding rotational velocity that is slower than the initial tape-feeding rotational velocity;

picking up the component using a nozzle head; and disposing the component on a predetermined location on the circuit board using the nozzle head.

8. The method of claim 7 wherein the decelerating step comprises camming the velocity control link against the contact unit such that the velocity control link experiences a velocity component that is generally perpendicular to a direction in which the tape carrier is being advanced.

9. The method of claim 8 wherein the camming step comprises:

configuring the contact unit on a frame of the tape feeding unit;

configuring a slot having a non-horizontal portion in a first end of said velocity control link;

contacting said contact unit with said slot; and translating said generally horizontal link in the direction in which the tape carrier is being advanced.

10. The method of claim 9 wherein the translating step further comprises reciprocating said generally horizontal link to move said slot back and forth on said contacting unit.

11. The method of claim 9 further comprising the step of configuring the link velocity control unit with a bias that urges the velocity control link away from the generally horizontal link.

12. The method of claim 11 wherein the bias is a torsion spring coupling the generally horizontal link and the velocity control link.

13. The method of claim 12 wherein the coupling step comprises:

attaching a first end of the torsion spring intermediate the first and second ends of the generally horizontal link; and attaching a second end of the torsion spring proximate to the slot.

\* \* \* \* \*